(12) United States Patent
Nakajima

(10) Patent No.: US 6,958,659 B2
(45) Date of Patent: Oct. 25, 2005

(54) TEST METHOD AND APPARATUS FOR VERIFYING FABRICATION OF TRANSISTORS IN AN INTEGRATED CIRCUIT

(75) Inventor: Kazuhiro Nakajima, Kanagawa (JP)

(73) Assignee: NEC Electronics Corporation, Kawasaki (JP)

(*) Notice: Subject to any disclaimer, the term of this patent is extended or adjusted under 35 U.S.C. 154(b) by 132 days.

(21) Appl. No.: 10/649,833

(22) Filed: Aug. 28, 2003

(65) Prior Publication Data

US 2004/0041641 A1 Mar. 4, 2004

(30) Foreign Application Priority Data

Aug. 29, 2002 (JP) .............................. 2002-251843

(51) Int. Cl.[7] .......................... H03B 25/00; G01R 31/02
(52) U.S. Cl. ............................ 331/57; 331/17; 331/44; 331/34; 331/25; 324/763
(58) Field of Search ............................. 257/48; 331/57, 331/17, 44, 34, 25; 327/291, 295, 158; 375/376; 324/500, 763, 765, 769

(56) References Cited

U.S. PATENT DOCUMENTS

| 4,473,762 A | 9/1984 | Iwahashi et al. |
| 5,666,088 A | 9/1997 | Penza |
| 6,188,293 B1 | 2/2001 | Miyagi et al. |
| 6,310,928 B1 * | 10/2001 | Yunome ..................... 375/376 |

(Continued)

FOREIGN PATENT DOCUMENTS

| EP | 0 634 837 A2 | 1/1995 |
| EP | 0 731 560 A1 | 9/1996 |

(Continued)

OTHER PUBLICATIONS

Horn "Electronics Theory with projects & experiments", fourth edition, TAB books, 1994 p. 336.*
European Search Report dated Mar. 26, 2004.

(Continued)

Primary Examiner—Michael B Shingleton
(74) Attorney, Agent, or Firm—McGinn IP Law Group, PLLC

(57) ABSTRACT

A ring oscillator for a test apparatus and method for verifying fabrication of transistors in an integrated circuit on a die under test is implemented. The ring oscillator is fabricated on the die and includes a positive feedback loop between a circuit output terminal and a feedback input terminal. The feedback loop includes a plurality of delaying stages connected in cascade. A transfer gate is coupled to each delaying stage. Each of the transfer gates includes a pair of transistors of the first and second conductivity types connected in parallel. The ring oscillator is operable to provide a first oscillator output signal during a first test mode when the transistors of the first conductivity type are ON and the transistors of the second conductivity type are OFF. The ring oscillator is operable to provide a second oscillator output signal during a second test mode when the transistors of the first conductivity type are OFF and the transistors of the second conductivity type are ON. The ring oscillator is operable to provide a third oscillator output signal during a third test mode when the transistors of the first conductivity type are ON and the transistors of the second conductivity type are ON.

8 Claims, 8 Drawing Sheets

U.S. PATENT DOCUMENTS 6,463,570 B1    10/2002  Dunn et al.
6,781,431 B2 *   8/2004  Taito et al. ................. 327/291

FOREIGN PATENT DOCUMENTS

| JP | 55-55621 | 4/1980 |
| JP | 7-104037 | 4/1995 |
| JP | 8-4104 | 1/1996 |

OTHER PUBLICATIONS

"Voltage-Controlled Oscillator", IBM Technical Disclosure Bulleting, vol. 33, No. 10A, Mar. 1, 1991, pp. 286-288, XP000110044.

* cited by examiner

| MODEL | P | N | NORMAL MODE |
|---|---|---|---|
| SLOW | 141.10 | 127.80 | 95.73 |
| TYP | 102.50 | 90.02 | 77.35 |
| FAST | 75.13 | 66.89 | 62.98 |
| PLNH | 90.18 | 127.30 | 79.44 |
| PHNL | 131.80 | 75.88 | 75.51 |

(nsec)

TEST METHOD AND APPARATUS FOR VERIFYING FABRICATION OF TRANSISTORS IN AN INTEGRATED CIRCUIT

FIELD OF THE INVENTION

The present invention relates to the fabrication of integrated circuit devices, and in particular to test methods and apparatuses for verifying fabrication of transistors in an integrated circuit device.

DESCRIPTION OF THE RELATED ART

P-channel and n-channel metal oxide semiconductor field effect transistors (MOSFETs) are used in modern integrated circuit (IC) devices. Poor formation of such transistors during fabrication leads to degraded performance of the integrated circuit device. Consequently, there is a need in the art for test methods and apparatuses to verify that satisfactory performance of the circuit has been achieved.

Existing test method and apparatus measures a period of a ring oscillator provided on a die being verified and compares the period to a predetermined specification. The ring oscillator for the die under test and circuitry thereon are formed during the same process steps. One example of test apparatus is described in Published Examined Japanese Patent Application No. H 08-4104 (JP-B2). Another example is described in Japanese Patent Laid-Open Application No. H 07-104037 (JP-A). The test apparatus described in JP-B2 No. H 08-4104 will be discussed below.

FIG. 6 is a plan view of a conventional integrated circuit (IC) die 100 and a conventional test apparatus that is described in JP-B2 No. Hei 8-4104. The conventional test apparatus includes a ring oscillator 102. The ring oscillator 102 and the IC are formed during the same process steps. The ring oscillator 102 includes a feedback input terminal 104, a circuit output terminal 106, and a positive feedback loop 108 between the circuit output terminal 106 and the feedback input terminal 104. The circuit output terminal 106 is connected to a terminal pad 110, which is one of terminal pads located on peripheral locations of the IC. The feedback loop 108 includes an odd number of inverting stages 112 connected in cascade.

The ring oscillator 102 is provided on each die on a wafer being verified. As is well known in the art, the dice are formed on a wafer of a semiconductor material, typically silicon, so that each wafer contains a plurality of IC dice. During wafer test, scan of the frequency of the ring oscillator for each die under test is made across the wafer. Deviations in the ring oscillator frequency from a preselected value delimit regions of the wafer.

FIG. 7 illustrates, in schematic form, a conventional ring oscillator 120 provided on a die 122 constituting an IC including, as basic components, p-channel and n-channel MOSFETs. The ring oscillator 120 includes a feedback input terminal 124, a circuit output terminal 126 connected to a pad 128, and a positive feedback loop 130. The feedback loop 130 includes an odd number (three in the illustrated example) of complementary metal oxide semiconductor (CMOS) inverters 132 connected in cascade.

Each inverter 132 is composed of a p-channel MOSFET 134 and an n-channel MOSFET 136. Common drains of the p-channel and n-channel MOSFETs 134 and 136 form the output of inverter 132. Gates 138 and 140 of the p-channel and n-channel MOSFETs 134 and 136 are connected to the input to inverter 132. The p-channel MOSFET 134 is connected between the supply rail Vcc and the output. The n-channel MOSFET 136 is connected between the output and the ground.

In the example shown in FIG. 7, the ring oscillator 120 includes an odd number, n (=3 in the example), of CMOS inverters 132 connected in cascade. The output of the first inverting stage 132 is connected to a first output node 142. Likewise, the output of the second inverting stage 132 is connected to a second output node 144. Lastly, the output of the third inverting stage 132 is connected to a third output node that corresponds to the circuit output terminal 126. The third output node 126 is connected to the feedback input terminal 124 and also to the pad 128. Output of the ring oscillator 120 constitutes an oscillatory signal having a period determined by delay due to the cascaded CMOS inverters 132. This will be further discussed below.

Oscillation of the ring oscillator 120 begins with application of supply voltage Vcc. Applying supply voltage Vcc causes potential at output node 126 to rise toward supply voltage Vcc from ground. This rising transition causes potential at first output node 142 to fall from voltage Vcc toward ground with delay Td1. This delay Td1 derives from OFF to ON transition of n-channel MOSFET 136 of the first stage CMOS inverter 132. The falling transition at node 142 causes potential at second output node 144 to rise toward voltage Vcc from ground with delay Td2. This delay Td2 derives from OFF to ON transition of p-channel MOSFET 134 of the second stage CMOS inverter 132. The rising transition at node 144 causes potential at third output node 126 to fall from voltage Vcc toward ground with delay Td3. This delay Td3 derives from OFF to ON transition of n-channel MOSFET 136 of the third stage CMOS inverter 132.

The falling transition at node 126 causes potential at first output node 142 to rise from ground toward supply voltage Vcc with delay Td4. This delay Td4 derives from OFF to ON transition of p-channel MOSFET 134 of the first stage CMOS inverter 132. The rising transition at node 142 causes potential at second output node 144 to fall from voltage Vcc toward ground with delay Td5. This delay Td5 derives from OFF to ON transition of n-channel MOSFET 136 of the second stage CMOS inverter 132. The falling transition at node 144 causes potential at third output node 126 to rise from ground toward voltage Vcc with delay Td6. This delay Td6 derives from OFF to ON transition of p-channel MOSFET 134 of the third stage CMOS inverter 132.

From the preceding description, it is noted that a period T of oscillatory signal of ring oscillator 120 can be expressed as follows:

$$T = Td1 + Td2 + Td3 + Td4 + Td5 + Td6 \qquad \text{Eq. 1}$$

Rising time of oscillatory signal from ground to supply voltage Vcc varies with different lengths of transition time required for p-channel MOSFET 134 of each CMOS inverter 132 to shift from OFF to ON. This transition time is determined by characteristic (threshold value) of p-channel MOSFET 134. Thus, the characteristic of p-channel MOSFET 134 of each CMOS inverter 132 determines the rising time of oscillatory signal provided by ring oscillator 120.

Falling time of oscillatory signal from supply voltage Vcc to ground varies with different lengths of transition time required for n-channel MOSFET 136 of each CMOS inverter 132 to shift from OFF to ON. This transition time is determined by characteristic (threshold value) of n-channel MOSFET 136. Thus, the characteristic of n-channel MOSFET 136 of each CMOS inverter 132 determines the falling time of oscillatory signal provided by ring oscillator 120.

Under the same conditions, same processes are used to fabricate all of n-channel and p-channel MOSFETs on a wafer. As a result, falling time of potential provided, as output, by each CMOS inverter 132 is common, and rising time of potential provided, as output, by each CMOS inverter 132 is common.

Expressing the falling time by Tdn and the rising time by Tdp, the period of ring oscillator 120 can be expressed, by rewriting the equation 1, as:

$$T = 3(Tdn + Tdp) \qquad \text{Eq. 2}$$

It is noted that the falling time Tdn corresponds to each of delays Td1, Td3 and Td5, which correspond to each other, and the rising time Tdp corresponds to each of delays Td2, Td4 and Td6, which correspond to each other.

According to the test method and apparatus, the period T of ring oscillator 120 is compared to a preselected specification to verify that satisfactory high speed operating characteristic (delay characteristic) of die under test has been achieved. This test method is justified because the delay of each CMOS inverter 132 depends on characteristics of p-channel and n-channel MOSFETs 134 and 136, which are fabricated by the same processes under the same conditions as p-channel and n-channel MOSFETs constituting IC under test are.

According to the test method and apparatus, the ring oscillator 120 superimposes the rising time Tdn provided by n-channel MOSFET 136 and the falling time Tdp provided by p-channel MOSFET 134 to make the delay of each CMOS inverter 132. The odd number of CMOS inverters 132 times the propagation delay makes the period T. The test apparatus determines whether a difference between the period T and a preselected value falls in a preselected deviation specification to verify that satisfactory operating speed is achieved by IC under test. This testing process cannot eliminate an undesired situation where a difference between the rising time Tdn and a preselected value exceeds a preselected deviation specification and/or a difference between the falling time Tdp and a preselected value exceeds a preselected deviation specification if the differences offset to each other to confine the difference between the period T and the preselected value within the preselected deviation specification. Thus, the test method and apparatus may verify that satisfactory operating speed is achieved by IC under test even if the n-channel MOSFETs and/or p-channel MOSFETs constituting the IC fail to meet the preselected deviation specification. There is a problem that this conventional test method and apparatus may not detect the presence of any failure of n-channel and/or p-channel MOSFETs to meet the preselected deviation specifications of large scale IC (LSI) being verified.

Recently, growing demand for high speed operation has caused the large scale ICs to operate at very high frequency. Under this operating condition, if, in a circuit portion relying heavily on operating speed of n-channel and/or p-channel MOSFETs, rising time or falling time of them is longer in excess of a preselected deviation specification, this circuit portion may cause a large scale IC to operate out of designed specification. The conventional test method and apparatus cannot detect the above-mentioned failure in original circuit components. Accordingly, a need remains for detecting any failure in n-channel and/or p-channel MOSFETs to meet a preselected deviation specification even if a period of a ring oscillator falls within a preselected deviation specification.

An object of the present invention is to meet the above-mentioned need.

A particular object of the present invention is to provide test method and apparatus, which can detect defective n-channel and/or p-channel MOSFETs on a die under.

Another object of the present invention is to provide a ring oscillator configured to provide outputs, which may be used for detection of defective n-channel and/or p-channel MOSFETs on a die under test.

SUMMARY OF THE INVENTION

One exemplary implementation of the present invention provides a ring oscillator. The ring oscillator comprises a feedback input terminal; a circuit output terminal for generating an oscillator output signal; and a positive feedback loop between the circuit output terminal and the feedback input terminal. The positive feedback loop includes a plurality of delaying stages connected in cascade. A transfer gate is coupled to each of the plurality of delaying stages. Each transfer gate includes a pair of transistors of the first and second conductivity types connected in parallel. The transistors of the first conductivity type are controlled by a first control signal. The transistors of the second conductivity type are controlled by a second control signal.

Another exemplary implementation of the present invention provides a test method for verifying fabrication of transistors in an integrated circuit, comprising:

providing a ring oscillator on a die under test during fabrication of said die, said ring oscillator including a plurality of delaying stages connected in cascade, and a transfer gate coupled to each of said plurality of delaying stages, each of said transfer gates including a pair of transistors of the first and second conductivity types connected in parallel, said transistors of the first conductivity type and said transistors of the second conductivity type being fabricated by same processes as transistors of the first conductivity type and transistors of the second conductivity type constituting an integrated circuit on said die;

measuring a first period of said ring oscillator by operating said ring oscillator to provide a first oscillator output signal during a first mode when said transistors of the first conductivity type of each of said transfer gates are ON and said transistors of the second conductivity type of each of said transfer gates are OFF;

measuring a second period of said ring oscillator by operating said ring oscillator to provide a second oscillator output signal during a second mode when said transistors of the first conductivity type of each of said transfer gates are OFF and said transistors of the second conductivity type of each of said transfer gates are ON;

measuring a third period of said ring oscillator by operating said ring oscillator to provide a third oscillator output signal during a third mode when said transistors of the first conductivity type of each of said transfer gates are ON and said transistors of the second conductivity type of each of said transfer gates are ON; and analyzing said first, second and third periods for decision making on whether said integrated circuit on said die meets preselected specification.

Further exemplary implementation of the present invention provides a test apparatus for verifying fabrication of transistors in an integrated circuit, comprising:

a ring oscillator provided on a die under test during fabrication of said die, said ring oscillator including a plurality of delaying stages connected in cascade, and a transfer gate coupled to each of said plurality of delaying stages, each of said transfer gates including a pair of transistors of the first and second conductivity types connected in parallel, said transistors of the first conductivity type and said transistors of the second conductivity type being fabricated by same processes as transistors of the first conductivity type and transistors of the second conductivity type constituting an integrated circuit on said die;

circuitry operable for measuring a first period of said ring oscillator by operating said ring oscillator to provide a first oscillator output signal during a first mode when said transistors of the first conductivity type of each of said transfer gates are ON and said transistors of the second conductivity type of each of said transfer gates are OFF, a second period of said ring oscillator by operating said ring oscillator to provide a second oscillator output signal during a second mode when said transistors of the first conductivity type of each of said transfer gates are OFF and said transistors of the second conductivity type of each of said transfer gates are ON, and a third period of said ring oscillator by operating said ring oscillator to provide a third oscillator output signal during a third mode when said transistors of the first conductivity type of each of said transfer gates are ON and said transistors of the second conductivity type of each of said transfer gates are ON; and circuitry operable for analyzing said first, second and third periods for decision making on whether said integrated circuit on said die meets preselected specification.

DETAILED DESCRIPTION OF THE INVENTION

The present invention is directed to a test method and an associated apparatus for verifying fabrication of transistors of the first and second conductivity types (e.g., n-channel MOSFETs and p-channel MOSFETs) constituting basic components of an integrated circuit IC on a die under test. The test apparatus includes a voltage controlled ring oscillator provided on the die being verified during fabrication of the IC. The ring oscillator has a structure including n-channel MOSFETs and p-channel MOSFETs of the IC. The n-channel and p-channel MOSFETs and their interconnection to make the ring oscillator are formed, for example, during the fabrication of diffusion, metal and polysilicon regions and vias/contacts between these regions that are used to fabricate the IC on a wafer. In exemplary implementations of the present invention discussed below, the ring oscillator is coupled to an external control circuit. The control circuit shifts a two-level first control voltage signal and a two-level second control voltage signal so that a transfer gate coupled to the input of each delaying inverting stage of the ring oscillator has its p-channel MOSFET directly controlled by the first control voltage signal and its n-channel MOSFET directly controlled by the second control voltage signal. In the exemplary implementations of the present invention, the first and second control signals shift the ring oscillator among three test modes. During the first mode, p-channel MOSFETs of the transfer gates are ON and n-channel MOSFETs of the transfer gates are OFF. During the second mode, the p-channel MOSFETs are OFF and the n-channel MOSFETs are ON. During the third mode, the p-channel MOSFETs are ON and the n-channel MOSFETs are ON.

During a selected one of the first, second, and third test modes, the ring oscillator provides one of three periods, namely, first, second and third period. During the first mode, the ring oscillator provides the first period, which depends heavily on the p-channel MOSFETs. During the second mode, the ring oscillator provides the second period, which depends heavily on the n-channel MOSFETs. During the third mode, the ring oscillator provides the third period, which depends heavily on both the p-channel and n-channel MOSFETs. The readings of these periods of the ring oscillator are analyzed. Using the readings of the first and second periods in combination with that of the third period, the defective IC die having p-channel and/or n-channel MOSFETs, which are outside of their preselected specifications, can be detected and culled. The exemplary implementations of the present invention are further discussed below in connection with the accompanying drawings.

Figure 1:
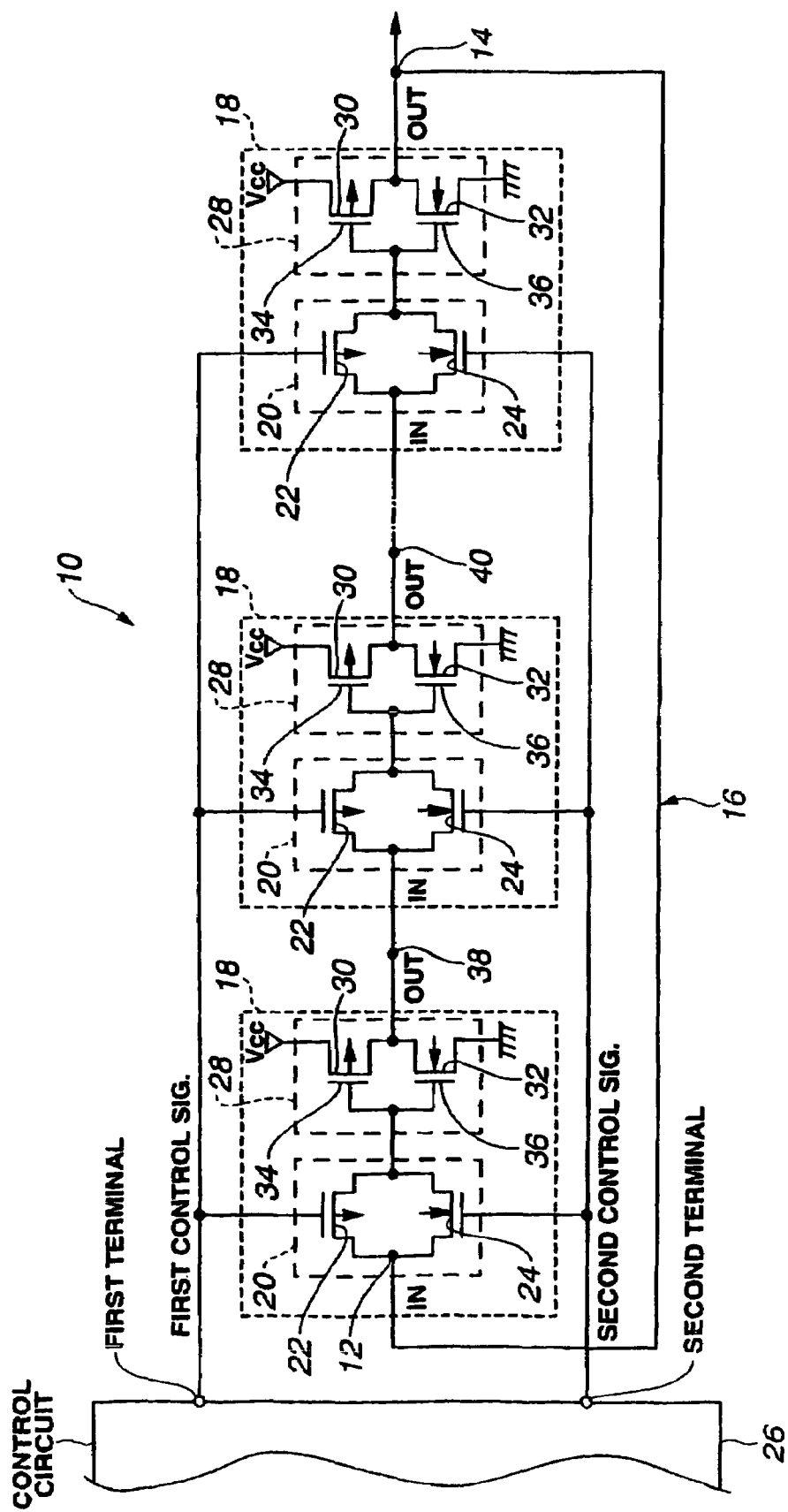
FIG. 1 is a diagram of a ring oscillator for a test method and apparatus in accordance with an embodiment of the present invention.

Referring to FIG. 1, an embodiment of ring oscillator is generally designated by the reference numeral 10. The ring oscillator 10, which is operable responsive to the first and second control signals, includes a feedback input terminal 12, a circuit output terminal 14 for generating an oscillator output signal, and a positive feedback loop 16 between the circuit output terminal 14 and the feedback input terminal 12. The positive feedback loop 16 includes a plurality of delaying inverting stages 18, in an odd number, connected in cascade. A transfer gate 20 is coupled to the input of each of the delaying inverting stages 18. Each transfer gate 20 includes a pair of complementary transistors of the first and second conductivity types connected in parallel. In the embodiment, a p-channel MOSFET 22 and an n-channel MOSFET 24 are connected in parallel to form the pair of complementary transistors of each transfer gate 20. The transistors of the first conductivity type, in the form of p-channel MOSFETs 22, are directly controlled by the first control signal. The transistors of the second conductivity type, in the form of n-channel MOSFETs 24, are directly controlled by the second control signal. A control circuit 26 shifts the first and second control signals so that the MOSFETs 22 of the transfer gates 20 are directly controlled by the first control signal and the MOSFETs 24 of the transfer gates 20 are directly controlled by the second control signal to establish any desired one test mode out of the first, second, and third modes.

Each delaying inverting stage 18 includes a CMOS inverter 28 having a p-channel MOSFET 30 and an n-channel MOSFET 32. Common drains of p-channel and n-channel MOSFETs 30 and 32 form the output of the CMOS inverter 28. Gates 34 and 36 of p-channel and n-channel MOSFETs 30 and 32 are connected to the input to the CMOS inverter 28. The p-channel MOSFET 30 of each CMOS inverter 28 is connected between the supply rail Vcc and the output. The n-channel MOSFET 32 of each CMOS inverter 28 is connected between the output and the ground. It should be noted that the n delaying inverting stages 18 are identical in structure to each other so that they are identical in delaying characteritic.

For simplicity of discussion, it is now assumed that, in FIG. 1, the ring oscillator 10 includes cascaded three delaying inverting stages 18. The output of the first inverting stage 18 is connected to a first output node 38. Likewise, the output of the second inverting stage 18 is connected to a second output node 40. Lastly, the output of the third inverting stage 18 is connected to a third output node that corresponds to the circuit output terminal 14. The third output node 14 is connected to the feedback input terminal 12. This will be further discussed below.

With continuing reference to FIG. 1, the control circuit 26 shifts the first control signal between supply voltage ("High") and ground potential ("Low), and it also shifts the second control signal between supply voltage ("High") and ground potential ("Low"). The operation of the ring oscillator 10 is described below.

During the first mode, the first control signal is at "Low" level and the second control signal is at "Low" level so that the p-channel MOSFET 22 of each transfer gate 20 is ON and the n-channel MOSFET 24 of the transfer gate 20 is OFF. Oscillation of the ring oscillator 10 during the first mode begins with application of supply voltage Vcc, causing potential at output node 14 to rise toward supply voltage Vcc from ground.

This rising transition at output node 14 causes potential at first output node 38 to fall from voltage Vcc toward ground with a sum of transmission delay Tdtp and transition delay Tdn. The transmission delay Tdtp depends on the p-channel MOSFET 22 of the first stage transfer gate 20 of the first delaying inverting stage 18. The transition delay Tdn derives from OFF to ON transition of n-channel MOSFET 32 of the first stage CMOS inverter 28.

The falling transition at node 38 causes potential at second output node 40 to rise toward voltage Vcc from ground with a sum of transmission delay Tdtp and transition delay Tdp. The transmission delay Tdtp depends on the p-channel MOSFET 22 of the second stage transfer gate 20. The transition delay Tdp derives from OFF to ON transition of p-channel MOSFET 30 of the second stage CMOS inverter 28.

The rising transition at node 40 causes potential at third output node 14 to fall from voltage Vcc toward ground with a sum of transmission delay Tdtp and transition delay Tdn. The transmission delay Tdtp depends on the p-channel MOSFET 22 of the third stage transfer gate 20. The transition delay Tdn derives from OFF to ON transition of n-channel MOSFET 32 of the third stage CMOS inverter 28.

The falling transition at node 14 causes potential at first output node 38 to rise from ground toward supply voltage Vcc with a sum of transmission delay Tdtp and transition delay Tdp. The transmission delay Tdtp depends on the p-channel MOSFET 22 of the first stage transfer gate 20. The transition delay Tdp derives from OFF to ON transition of p-channel MOSFET 30 of the first stage CMOS inverter 28.

The rising transition at node 38 causes potential at second output node 40 to fall from voltage Vcc to ground with delay a sum of transmission delay Tdtp and transition delay Tdn. The transmission delay Tdtp depends on the p-channel MOSFET 22 of the second stage transfer gate 20. The transition delay Tdn derives from OFF to ON transition of n-channel MOSFET 32 of the second stage CMOS inverter 28.

The falling transition at node 40 causes potential at third output node 14 to rise from ground toward voltage Vcc with a sum of transmission delay Tdtp and transition delay Tdp. The transmission delay Tdtp depends on the p-channel MOSFET 22 of the third stage transfer gate 20. The transition delay Tdp derives from OFF to ON transition of p-channel MOSFET 32 of the third stage CMOS inverter 28.

The period Tp of ring oscillator 10 during this first mode can be expressed as:

$$Tp = 6Tdtp + 3(Tdp + Tdn) \qquad \text{Eq.3}$$

During the second mode, the first control signal is at "High" level and the second control signal is at "High" level so that the p-channel MOSFET 22 of each transfer gate 20 is OFF and the n-channel MOSFET 24 of the transfer gate 20 is ON. Oscillation of the ring oscillator 10 during the second mode begins with application of supply voltage Vcc, causing potential at output node 14 to rise toward supply voltage Vcc from ground.

Oscillation during the second mode is different from oscillation during the first mode only in that transmission delay Tdtn dependent on the n-channel MOSFET 24 has replaced the transmission delay Tdtp dependent on the p-channel MOSFET 22. Thus, the period Tn of ring oscillator 10 during the second mode can be expressed as:

$$Tn = 6Tdtn + 3(Tdp + Tdn) \qquad \text{Eq.4}$$

During the third mode, the first control signal is at "Low" level and the second control signal is at "High" level so that the p-channel MOSFET 22 of each transfer gate 20 is ON and the n-channel MOSFET 24 of the transfer gate 20 is ON. Oscillation of the ring oscillator 10 during the third mode begins with application of supply voltage Vcc, causing potential at output node 14 to rise toward supply voltage Vcc from ground.

Oscillation during the third mode is different from oscillation during the first or second mode only in that transmission delay Tdt dependent on the parallel relation of the p-channel MOSFET 22 and the n-channel MOSFET 24 has replaced the transmission delay Tdtp or Tdtn. Thus, the period Tt of ring oscillator 10 during the third mode can be expressed as:

$$Tt = 6Tdt + 3(Tdp + Tdn) \qquad \text{Eq.5}$$

In the above-mentioned manner, the ring oscillator 10 provides three periods Tp, Tn, and Tt during the first, second, and third modes. The first period Tp is heavily dependent on the p-channel MOSFET 22. The second period Tn is heavily dependent on the n-channel MOSFET 24. The third period Tt is dependent on the total characteristic of the p-channel and n-channel MOSFETs 22 and 24.

As mentioned before, the p-channel and n-channel constituting the IC are identical in structure to the p-channel and n-channel MOSFETs 22 and 24 of the ring oscillator 10. Thus, the periods Tp, Tn, and Tt of the ring oscillator 10 correspond to a period reflecting the p-channel MOSFETs of the IC, a period reflecting the n-channel MOSFETs of the IC, and a period reflecting the total of the p-channel and n-channel MOSFETs of the IC, respectively.

As the discussion proceeds further, it will be understood that measuring the first, second, and third periods Tp, Tn, and Tt of the ring oscillator 10 and analyzing them in comparison with their preselected specifications may allow for culling of an IC die under test if the p-channel or n-channel dependent period Tp or Tn fails outside of its preselected specification under the condition where the period Tt is within its preselected specification.

Figure 2:
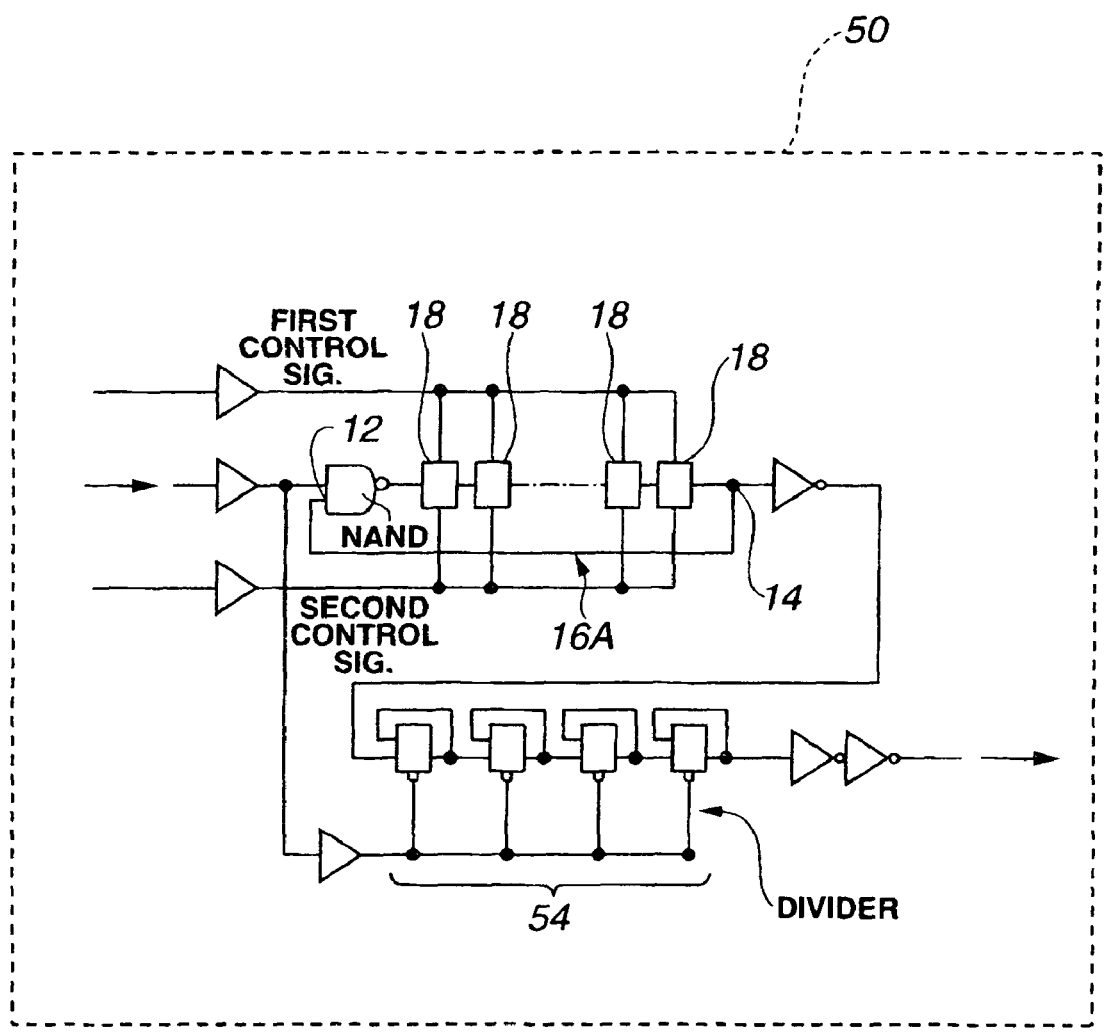
FIG. 2 is a diagram of another ring oscillator for a test method and apparatus in accordance with an embodiment of the present invention.

Referring now to FIG. 2, another embodiment of ring oscillator is generally designated by the reference numeral 50. The ring oscillator 50 is substantially the same as the ring oscillator 10 in that it includes a feedback input terminal 12, a circuit output terminal 14 for generating an oscillator output signal, and a positive feedback loop 16A between the circuit output terminal 14 and the feedback input terminal 12. The positive feedback loop 16A is substantially the same as the feedback loop 16 in that it includes a plurality of delaying inverting stages 18 connected in cascade, each delaying inverting stage including a CMOS inverter 28 and a transfer gate 20 coupled to the input of the CMOS inverter 28 (see FIG. 1). However, the feedback loop 16A is different from the feedback loop 16 in that it includes an NAND input stage 52. A divider 54 composed of a plurality of flip-flop circuits may be provided to divide the oscillator output signal if need arises for coupling to a measuring apparatus.

The feedback input terminal 12 is coupled to a first input of the NAND input stage 52. An oscillation permitting signal is imparted to a second input of the NAND input stage 52. An output of the NAND input stage 52 is coupled to the input of the first delaying inverting stage 18 that follows the NAND input stage 52. As the discussion proceeds, it will be understood that the NAND input stage 52 works as an inverting stage when the oscillation-permitting signal is imparted to the first input thereof. The following delaying inverting stages 18 may be an even number so that the total number of inverters in the loop 16 of the ring oscillator 50 is odd.

Figure 3:
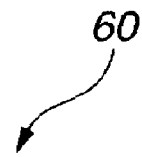
FIG. 3 is a table showing simulation of measuring periods of the ring oscillator during three different modes for various test models.

Referring to FIG. 3, there is shown a Table, generally designated 60, containing simulation result of the ring oscillator 50 including ten delaying inverting stages 18. For different p-channel and n-channel MOSFETs in delay characteristic, the ring oscillator 50 is simulated to provide first, second, and third periods during first mode, second mode, and third mode.

In the Table 60, "SLOW", "TYP", "FAST", "PLNH", and "PHNL" are five different combinations (MODELS) of delay characteristics of p-channel and n-channel MOSFETs constituting the ring oscillator 50. Under the model "SLOW", both p-channel and n-channel MOSFETs have high thresholds so that their transmission delays are long. Under the model "TYP", both p-channel and n-channel MOSFETs have optimum thresholds so that their transmission delays are optimal. Under the model "FAST", both p-channel and n-channel MOSFETs have low thresholds so that their transmission delays are short. Under the model "PLNH", the p-channel MOSFET has a low threshold, but the n-channel MOSFET has a high threshold. Under the model "PHNL", the p-channel MOSFET has a high threshold, but the n-channel MOSFET has a low threshold.

In the Table 60, "P", "N", and "NORMAL MODE" are headings. Under "P", readings of p-channel MOSFET dependent period provided by the ring oscillator 50 during the first mode are shown for different MODELS. Under "N", readings of n-channel MOSFET dependent period provided by the ring oscillator 50 during the second mode are shown for the different MODELS. Under "NORMAL MODE", readings of both p-channel and n-channel MOSFETs dependent period provided by the ring oscillator 50 during the third mode are shown for the five different MODELS.

If, as in the prior art, the readings under "NORMAL MODE" are compared to its preselected specification of less than, for example, 80 nsec, the models "TYP", "FAST", "PLNH", and "PHNL" will pass the test, but the model "SLOW" will fail to pass the test. According to this test methodology, only the model "SLOW" may be eliminated. According to exemplary implementation of the present invention, the readings under "P" and "N" are compared to their preselected specifications of less than, for example, 120 nsec for the models "TYP", "FAST", "PLNH", and "PHNL" that have past the previous test. According to this test methodology, the models "PLNH" and "PHNL" will not pass the test and may be eliminated.

Figure 4A:
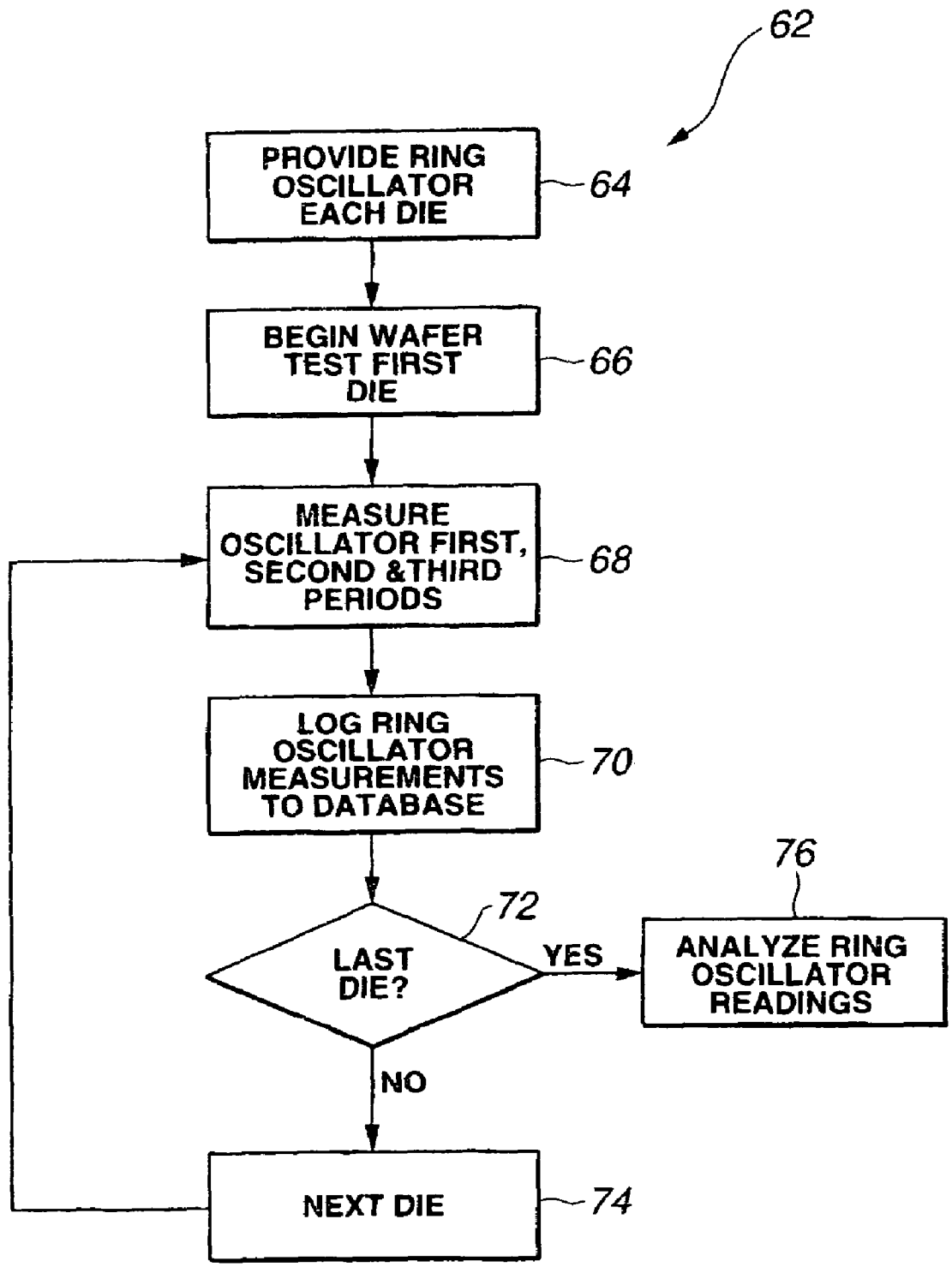
FIGS. 4A and 4B illustrates, in flow chart form, a test method in accordance with an embodiment of the present invention.

The present invention may be further understood by referring now to FIG. 4A, illustrating in flow chart form, a portion of a test method 62 in accordance with an embodiment of the present invention. In step 64, a ring oscillator 10 or 50 (see FIGS. 1 and 2) is provided on each die of a wafer being fabricated. The p-channel and n-channel MOSFETs constituting each ring oscillator are fabricated with p-channel and n-channel MOSFETs constituting integrated circuit (s) on the wafer. In step 66, testing of the wafer begins with a first die. In step 68, first, second, and third periods of the ring oscillator on the current die are measured by operating the ring oscillator to provide a first oscillator output signal during the first mode, by operating the ring oscillator to provide a second oscillator output signal during the second mode, and by operating the ring oscillator to provide a third oscillator output signal during the third mode, respectively. In step 70, the ring oscillator measurements are logged to a database. The die may be identified and logged based on the position on the wafer. The position may be specified in terms of an artesian (x, y) coordinate system defined by the wafer.

In step 72, it is determined if the current die under test is the last die to be tested. If not, in step 74 the process proceeds to the next die and loops back to step 68. The process then loops over steps 68, 70, and 72 until all dice have been tested, and then, step 72 proceeds by the "Yes" branch to step 76. In step 76, the ring oscillator data logged are analyzed.

Figure 4B:
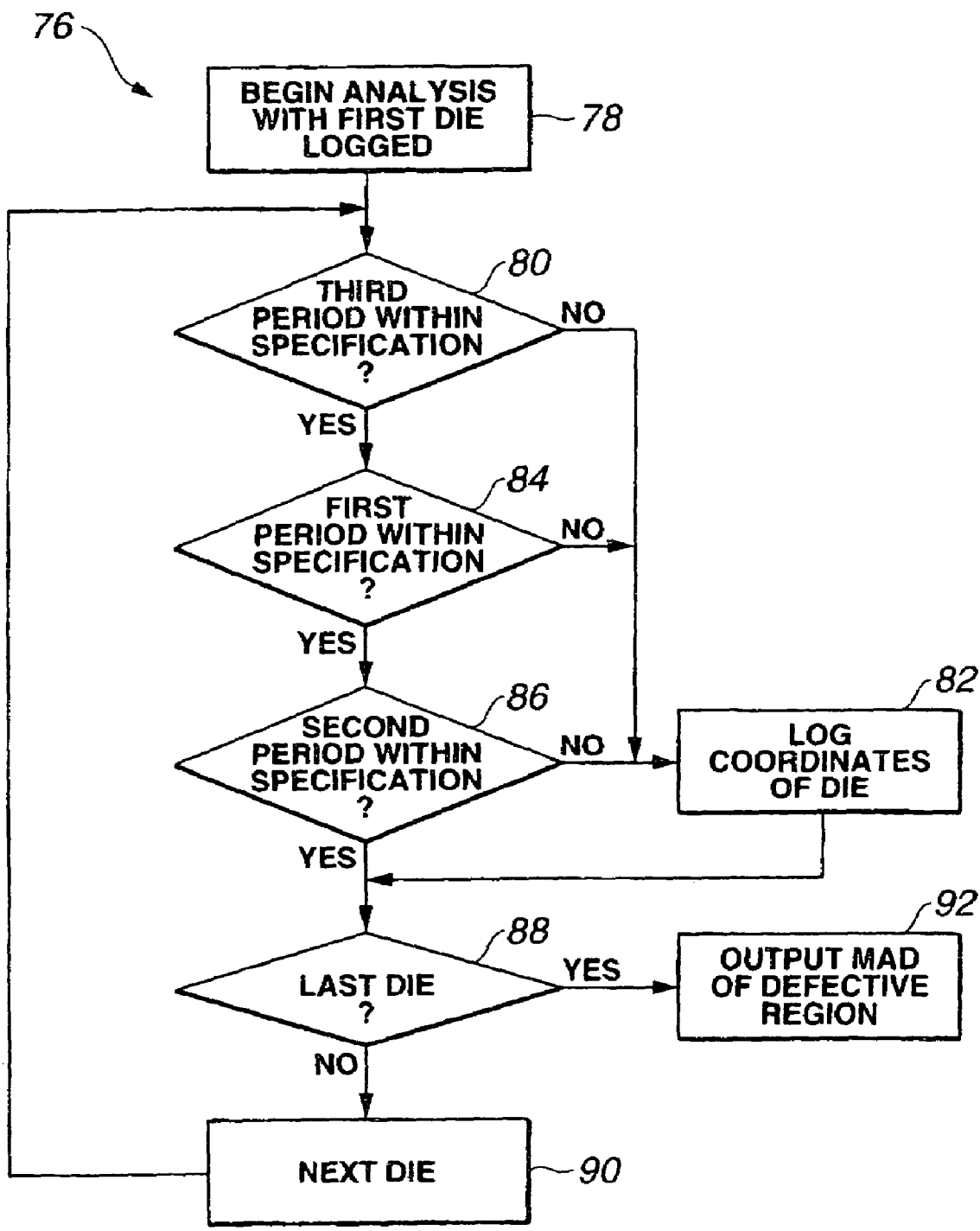

Referring now to FIG. 4B, illustrating, in flow chart form, analysis step 76, in further detail. In step 78, the analysis begins with the first die logged. In step 80, it is determined if the measured third period falls within a selected specification. For example, in step 80 it may be determined if the third period of the ring oscillator is less than a selected limit of 80 nsec. If, in step 80, the third period of the ring oscillator on the die under test is outside of the selected specification, then the coordinates of the die are logged to the database in step 82, or otherwise recorded. If however, the third period of the ring oscillator on the die under test is within the selected specification, in step 84 it is determined if the measured first period falls within a selected specification. For example, in step 84 it may be determined if the first period of the ring oscillator on the die under test is less than a selected limit of 120 nsec. If, in step 84, the first period of the ring oscillator on the die under test is outside of the selected specification thereof, then the coordinates of the die are logged to the database in step 82, or otherwise recorded. If however, the first period of the ring oscillator on the die under test is within the selected specification thereof, in step 86 it is determined if the measured second period of the ring oscillator on the die under test falls within a selected specification. For example, in step 86 it may be determined if the second period of the ring oscillator on the die under test is less than a selected limit of 120 nsec. If, in step 86, the second period of the ring oscillator on the die under test is outside of the selected specification thereof, then the coordinates of the die are logged to the database in step 82, or otherwise recorded. If however, the second period of the ring oscillator on the die under test is within the selected specification thereof, in step 88 it is determined if the current die is the last die logged to the database. If not the methodology proceeds to the next die in step 90, and then loops over the remaining dice logged into the database in step 70, in FIG. 4B. If however, in step 88 all the logged dice have been screened, in step 92 a map of the defective region on the corresponding wafer is output. This map may be generated from the x-y coordinates of the dice logged in step 82. Those dice that are out of specification, and which would reduce performance may be culled without sacrificing the entire wafer.

Figure 5:
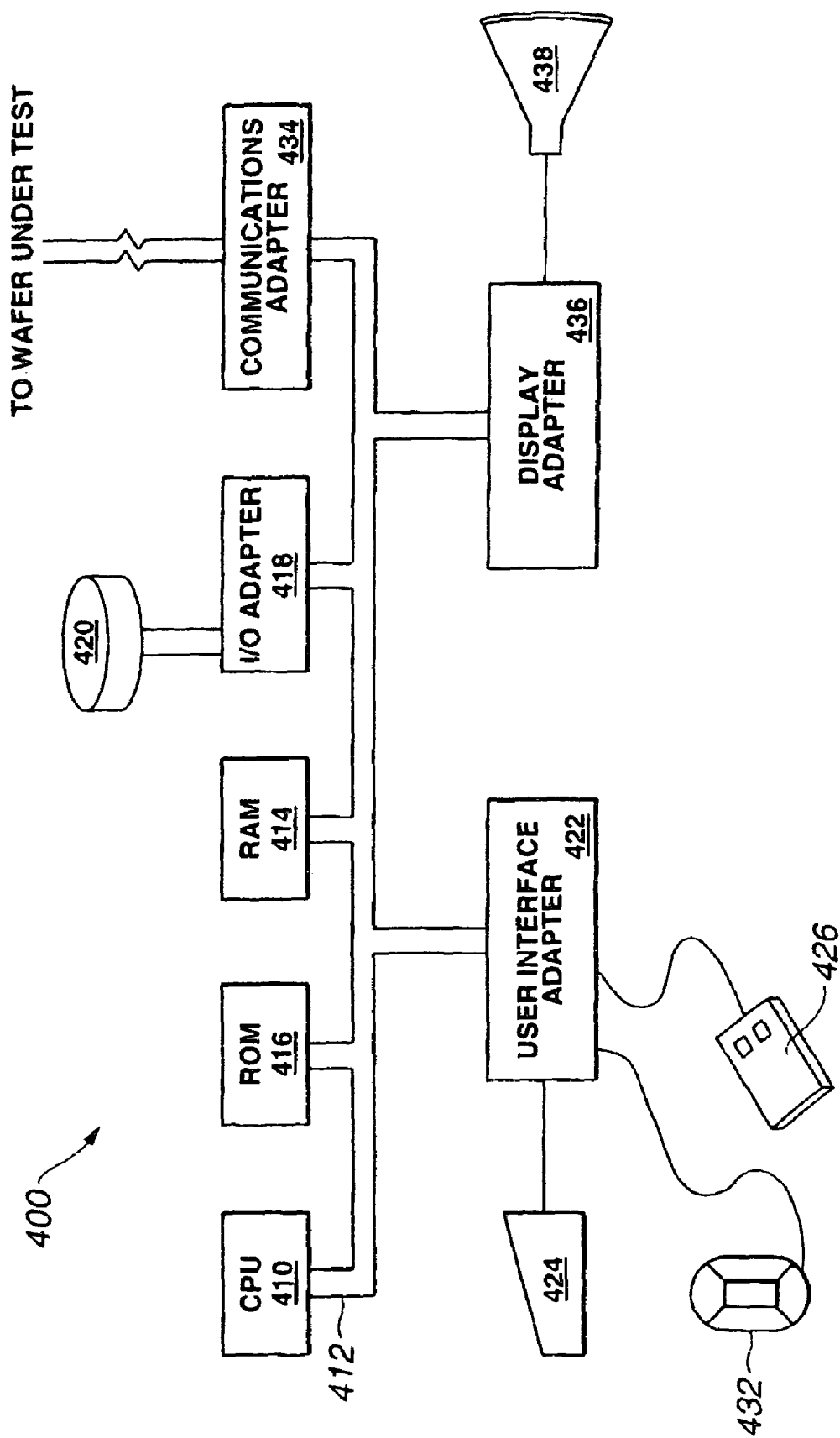
FIG. 5 illustrates, in block diagram form, a data processing system in accordance with an embodiment of the present invention.
Figure 6:
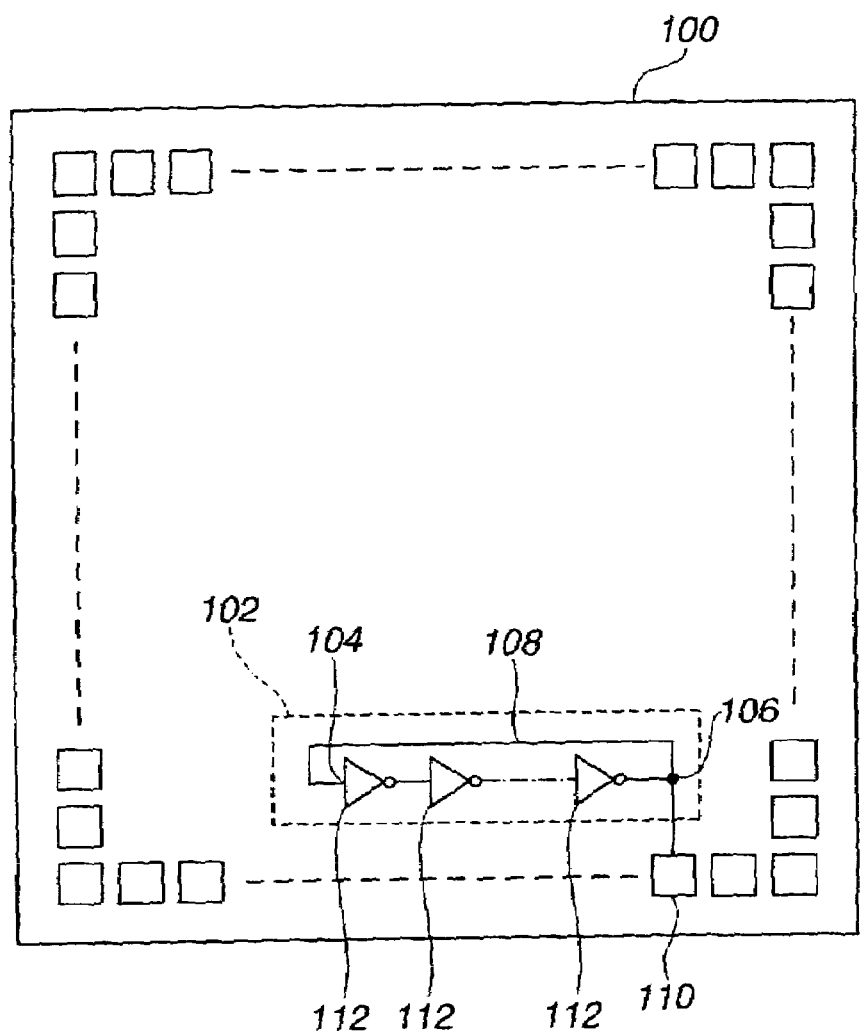
FIG. 6 illustrates a conventional ring oscillator provided on a die.
Figure 7:
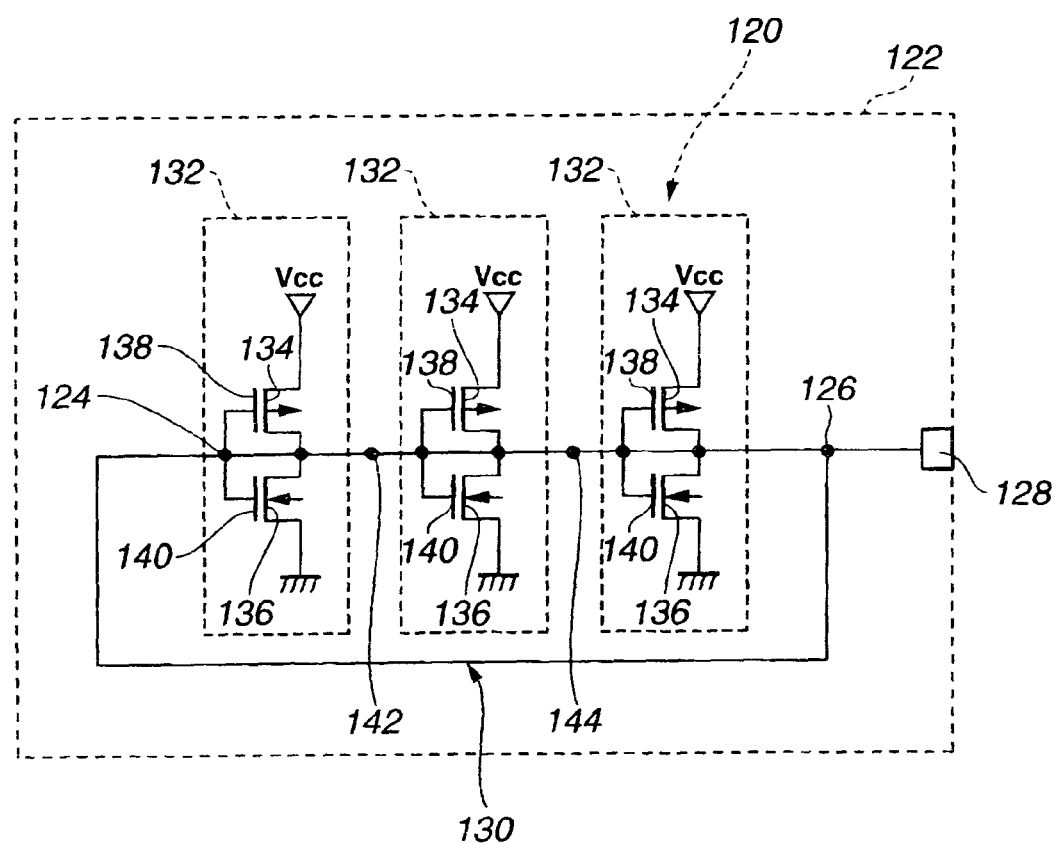
FIG. 7 illustrates another conventional ring oscillator.

The method according to the embodiment of the present invention may be performed by a data processing system coupled to the wafer under test. In FIG. 5, an example is shown of a data processing system 400, which may be used for the invention. The system has a central processing unit (CPU) 410, which is coupled to various other components by system bus 412. Read only memory (ROM) 416 is coupled to the system bus 412. Random access memory (RAM) 414, I/O adapter 418, and communication adapter 434 are also coupled to the system bus 412. The I/O adapter 418 may be a small computer system interface adapter that communicates with a disk storage device 420. The communication adapter 434 interconnects the system bus 412 and the wafer under test. Input/Output devices are also connected to the system bus 412 via user interface adapter 422 and display adapter 436. Keyboard 424, track ball 432 and mouse 426 are all connected to the system bus 412 via user interface adapter 422. Display monitor 438 is connected to the system bus 412 by display adapter 436. In this manner, a user is capable of inputting to the system throughout the keyboard 424, trackball 432 or mouse 426 and receiving output from the system via display 438.

Preferred implementations of the present invention include implementations as a computer system programmed to execute the method described herein, and as a computer program product. According to the computer system implementation, sets of instructions for executing the method are resident in the random access memory 414 of one or more computer systems configured generally as described above. Until required by the computer system, the set of instructions may be stored as a computer program product in another computer memory, for example, in disk drive 420. The disk drive 420 may include a removable memory such as an optical disk or floppy disk for eventual use in the disk drive 420. Further, the computer program product can also be stored at another computer and transmitted when desired to the user's work station by a network or by an external network such as the Internet. One skilled in the art would appreciate that the physical storage of the sets of instructions physically changes the medium upon which it is stored so that the medium carries computer readable information. The change may be electrical, magnetic, chemical, biological, or some other physical change. While it is convenient to describe the embodiment of the present invention in terms of instructions, or the like, the reader should remember that all of these and similar terms should be associated with the appropriate physical elements.

Although the present invention and its advantage have been described in detail, it should be understood that various changes, substitutions and alternations could be made herein without departing from the sprit and scope of the invention.

This application claims the priority of Japanese Patent Application No. 2002-251843, filed Aug. 29, 2002, the disclosure of which is hereby incorporated by reference in its entirety.

What is claimed is:

1. A test method for verifying fabrication of transistors in an integrated circuit, said test method comprising:

providing a ring oscillator on a die under test during fabrication of said die, said ring oscillator including a plurality of delaying stages connected in cascade, and a like plurality of transfer gates, each transfer gate coupled to a corresponding one of said plurality of delaying stages, each of said transfer gates including a pair of transistors of first and second conductivity types connected in parallel, said transistors of the first conductivity type and said transistors of the second conductivity type being fabricated by the same processes as transistors of the first conductivity type and transistors of the second conductivity type constituting an integrated circuit on said die;

measuring a first period of said ring oscillator by operating said ring oscillator to provide a first oscillator output signal during a first mode when said transistors of the first conductivity type of each of said transfer gates are ON and said transistors of the second conductivity type of each of said transfer gates are OFF;

measuring a second period of said ring oscillator by operating said ring oscillator to provide a second oscillator output signal during a second mode when said transistors of the first conductivity type of each of said transfer gates are OFF and said transistors of the second conductivity type of each of said transfer gates are ON;

measuring a third period of said ring oscillator by operating said ring oscillator to provide a third oscillator output signal during a third mode when said transistors of the first conductivity type of each of said transfer gates are ON and said transistors of the second conductivity type of each of said transfer gates are ON; and analyzing said first, second and third periods for decision making on whether said integrated circuit on said die meets preselected specification.

2. The test method as claimed in claim 1, wherein analyzing includes:

comparing said first period with a first preselected specification;

comparing said second period with a second preselected specification; and comparing said third period with a third preselected specification.

3. The test method as claimed in claim 1, wherein the total number of said plurality of delaying stages is odd, wherein each of said delaying stages includes a CMOS inverter, and wherein said pair of transistors of each transfer gate are p-channel and n-channel transistors, respectively.

4. The test method as claimed in claim 1, wherein said ring oscillator includes an NAND input stage, wherein the total number of said plurality of delaying stages is even, and wherein each of said delaying stages includes a CMOS inverter, and wherein said first and second conductivity type transistors are p-channel and n-channel transistors, respectively.

5. A test apparatus for verifying fabrication of transistors in an integrated circuit, said test apparatus comprising:
- a ring oscillator provided on a die under test during fabrication of said die, said ring oscillator including a plurality of delaying stages connected in cascade, and a like plurality of transfer gates, each transfer gate coupled to a corresponding one of said plurality of delaying stages, each of said transfer gates including a pair of transistors of first and second conductivity types connected in parallel, said transistors of the first conductivity type and said transistors of the second conductivity type being fabricated by the same processes as transistors of the first conductivity type and transistors of the second conductivity type constituting an integrated circuit on said die;
- circuitry operable for measuring
- a first period of said ring oscillator by operating said ring oscillator to provide a first oscillator output signal during a first mode when said transistors of the first conductivity type of each of said transfer gates are ON and said transistors of the second conductivity type of each of said transfer gates are OFF,
- a second period of said ring oscillator by operating said ring oscillator to provide a second oscillator output signal during a second mode when said transistors of the first conductivity type of each of said transfer gates are OFF and said transistors of the second conductivity type of each of said transfer gates are ON, and
- a third period of said ring oscillator by operating said ring oscillator to provide a third oscillator output signal during a third mode when said transistors of the first conductivity type of each of said transfer gates are ON and said transistors of the second conductivity type of each of said transfer gates are ON; and
- circuitry operable for analyzing said first, second and third periods for decision making on whether said integrated circuit on said die meets preselected specification.

6. The test apparatus as claimed in claim 5, wherein said circuitry operable for analyzing includes:
- circuitry operable for comparing said first period with a first preselected specification;
- circuitry operable for comparing said second period with a second preselected specification; and
- circuitry operable for comparing said third period with a third preselected specification.

7. A computer program product embodied in a storage media, the computer program product including a program of instructions for performing a test method, the test method comprising:
- measuring a first period of a ring oscillator for a die under test,
- wherein said ring oscillator is provided on said die during fabrication of said die, said ring oscillator including a plurality of delaying stages connected in cascade, and a like plurality of transfer gates, each transfer gate coupled to a corresponding one of said plurality of delaying stages, each of said transfer gates including a pair of transistors of first and second conductivity types connected in parallel, said transistors of the first conductivity type and said transistors of the second conductivity type being fabricated by the same processes as transistors of the first conductivity type and transistors of the second conductivity type constituting an integrated circuit on said die,
- said measuring said first period being carried out by operating said ring oscillator to provide a first oscillator output signal during a first mode when said transistors of the first conductivity type of each of said transfer gates are ON and said transistors of the second conductivity type of each of said transfer gates are OFF;
- measuring a second period of said ring oscillator by operating said ring oscillator to provide a second oscillator output signal during a second mode when said transistors of the first conductivity type of each of said transfer gates are OFF and said transistors of the second conductivity type of each of said transfer gates are ON;
- measuring a third period of said ring oscillator by operating said ring oscillator to provide a third oscillator output signal during a third mode when said transistors of the first conductivity type of each of said transfer gates are ON and said transistors of the second conductivity type of each of said transfer gates are ON; and
- analyzing said first, second and third periods for decision making on whether said integrated circuit on said die meets preselected specification.

8. The computer program product as claimed in claim 7, wherein said analyzing includes:
- comparing said first period with a first preselected specification;
- comparing said second period with a second preselected specification; and
- comparing said third period with a third preselected specification.

* * * * *